US012621931B2

(12) United States Patent
Petivan et al.

(10) Patent No.: US 12,621,931 B2
(45) Date of Patent: May 5, 2026

(54) GUIDED PAD STRUCTURES FORMED IN CIRCUIT BOARD

(71) Applicant: Dell Products L.P., Round Rock, TX (US)

(72) Inventors: James L. Petivan, Austin, TX (US); Bhyrav M. Mutnury, Austin, TX (US); Sandor T. Farkas, Round Rock, TX (US)

(73) Assignee: Dell Products L.P., Round Rock, TX (US)

( * ) Notice: Subject to any disclaimer, the term of this patent is extended or adjusted under 35 U.S.C. 154(b) by 286 days.

(21) Appl. No.: 18/486,009

(22) Filed: Oct. 12, 2023

(65) Prior Publication Data

US 2025/0126713 A1    Apr. 17, 2025

(51) Int. Cl.
*H05K 1/11*        (2006.01)
(52) U.S. Cl.
CPC ... *H05K 1/117* (2013.01); *H05K 2201/09036* (2013.01); *H05K 2201/09709* (2013.01)

(58) Field of Classification Search
CPC ......... H05K 1/117; H05K 2201/09036; H05K 2201/09709
See application file for complete search history.

(56) References Cited

U.S. PATENT DOCUMENTS

2003/0216062 A1* 11/2003 Kamiyamane ....... H01R 12/721
                                        439/65
2006/0189175 A1*  8/2006 Kinsley .................. H05K 3/403
                                        439/66
2016/0249454 A1*  8/2016 Beaman ................. H05K 1/117
2021/0384661 A1* 12/2021 Coteus ................. H01R 12/721

* cited by examiner

*Primary Examiner* — Nathan Milakovich
(74) *Attorney, Agent, or Firm* — Jackson Walker L.L.P.

(57)        ABSTRACT
A circuit board may include a plurality of electrically-conductive layers separated and supported by a plurality of dielectric layers of insulating material laminated together and a channel formed at an edge of the circuit board through at least one dielectric layer of the plurality of dielectric layers within which an electrically-conductive pad is formed from an internal electrically-conductive layer of one of the plurality of electrically-conductive layers.

21 Claims, 8 Drawing Sheets

GUIDED PAD STRUCTURES FORMED IN CIRCUIT BOARD

TECHNICAL FIELD

The present disclosure relates in general to information handling systems, and more particularly to improving connectivity of pads at an edge of a circuit board to pins of a connector of another circuit board, to enhance signal quality over existing approaches.

BACKGROUND

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

Information handling systems may often use one or more circuit boards. A circuit board may comprise a substrate of a plurality of conductive layers separated and supported by layers of insulating material laminated together, with conductive traces disposed on and/or in any of such conductive layers, with vias for coupling conductive traces of different layers together, and with pads for coupling electronic components (e.g., packaged integrated circuits, slot connectors, etc.) to conductive traces of the circuit board.

Oftentimes, circuit boards are coupled to one another via connectors present on the respective circuit board. For example, a first circuit board may have a receptacle connector mounted on a surface thereof or mounted at the edge thereof for receiving a corresponding edge connector formed on an edge of a second circuit board. As signal speeds continue to increase as electrical and computing technology advances, small parasitic artifacts present within circuit boards and connectors may have significant impact on signal integrity of electrical signals communicated within such circuit boards and connectors. Accordingly, systems and methods for minimizing such parasitic artifacts may be desired.

SUMMARY

In accordance with the teachings of the present disclosure, the disadvantages and problems associated with traditional approaches to coupling pads at an edge of a circuit board to pins of a connector or another circuit board may be substantially reduced or eliminated.

In accordance with embodiments of the present disclosure, a circuit board may include a plurality of electrically-conductive layers separated and supported by a plurality of dielectric layers of insulating material laminated together and a channel formed at an edge of the circuit board through at least one dielectric layer of the plurality of dielectric layers within which an electrically-conductive pad is formed from an internal electrically-conductive layer of one of the plurality of electrically-conductive layers.

In accordance with these and other embodiments of the present disclosure, an information handling system may include a processor and a circuit board comprising a plurality of electrically-conductive layers separated and supported by a plurality of dielectric layers of insulating material laminated together and a channel formed at an edge of the circuit board through at least one dielectric layer of the plurality of dielectric layers within which an electrically-conductive pad is formed from an internal electrically-conductive layer of one of the plurality of electrically-conductive layers.

In accordance with these and other embodiments of the present disclosure, a method may include, in a circuit board having a plurality of electrically-conductive layers separated and supported by a plurality of dielectric layers of insulating material laminated together, forming a channel at an edge of the circuit board through at least one dielectric layer of the plurality of dielectric layers and forming within the channel an electrically-conductive pad from an internal electrically-conductive layer of one of the plurality of electrically-conductive layers.

Technical advantages of the present disclosure may be readily apparent to one skilled in the art from the figures, description and claims included herein. The objects and advantages of the embodiments will be realized and achieved at least by the elements, features, and combinations particularly pointed out in the claims.

It is to be understood that both the foregoing general description and the following detailed description are examples and explanatory and are not restrictive of the claims set forth in this disclosure.

BRIEF DESCRIPTION OF THE DRAWINGS

A more complete understanding of the present embodiments and advantages thereof may be acquired by referring to the following description taken in conjunction with the accompanying drawings, in which like reference numbers indicate like features, and wherein.

DETAILED DESCRIPTION

Preferred embodiments and their advantages are best understood by reference to FIGS. 1 through 4C, wherein like numbers are used to indicate like and corresponding parts.

For purposes of this disclosure, an information handling system may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, or other purposes. For example, an information handling system may be a personal computer, a network storage device, or any other suitable device and may vary in size, shape, performance, functionality, and price. The information handling system may include random access memory (RAM), one or more processing resources such as a central processing unit (CPU) or hardware or software control logic, ROM, and/or other types of nonvolatile memory. Additional components of the information handling system may include one or more disk drives, one or more network ports for communicating with external devices as well as various input and output (I/O) devices, such as a keyboard, a mouse, and a video display. The information handling system may also include one or more buses operable to transmit communications between the various hardware components.

For the purposes of this disclosure, information handling resources may broadly refer to any component system, device or apparatus of an information handling system, including without limitation processors, service processors, basic input/output systems, buses, memories, I/O devices and/or interfaces, storage resources, network interfaces, motherboards, air movers, sensors, power supplies, and/or any other components and/or elements of an information handling system.

For the purposes of this disclosure, circuit boards may broadly refer to printed circuit boards (PCBs), printed wiring boards (PWBs), printed wiring assemblies (PWAs), etched wiring boards, and/or any other board or similar physical structure operable to mechanically support and electrically couple electronic components (e.g., packaged integrated circuits, slot connectors, etc.). A circuit board may comprise a substrate of a plurality of conductive layers separated and supported by layers of insulating material laminated together, with conductive traces disposed on and/or in any of such conductive layers, with vias for coupling conductive traces of different layers together, and with pads for coupling electronic components (e.g., packaged integrated circuits, slot connectors, etc.) to conductive traces of the circuit board.

Figure 1:
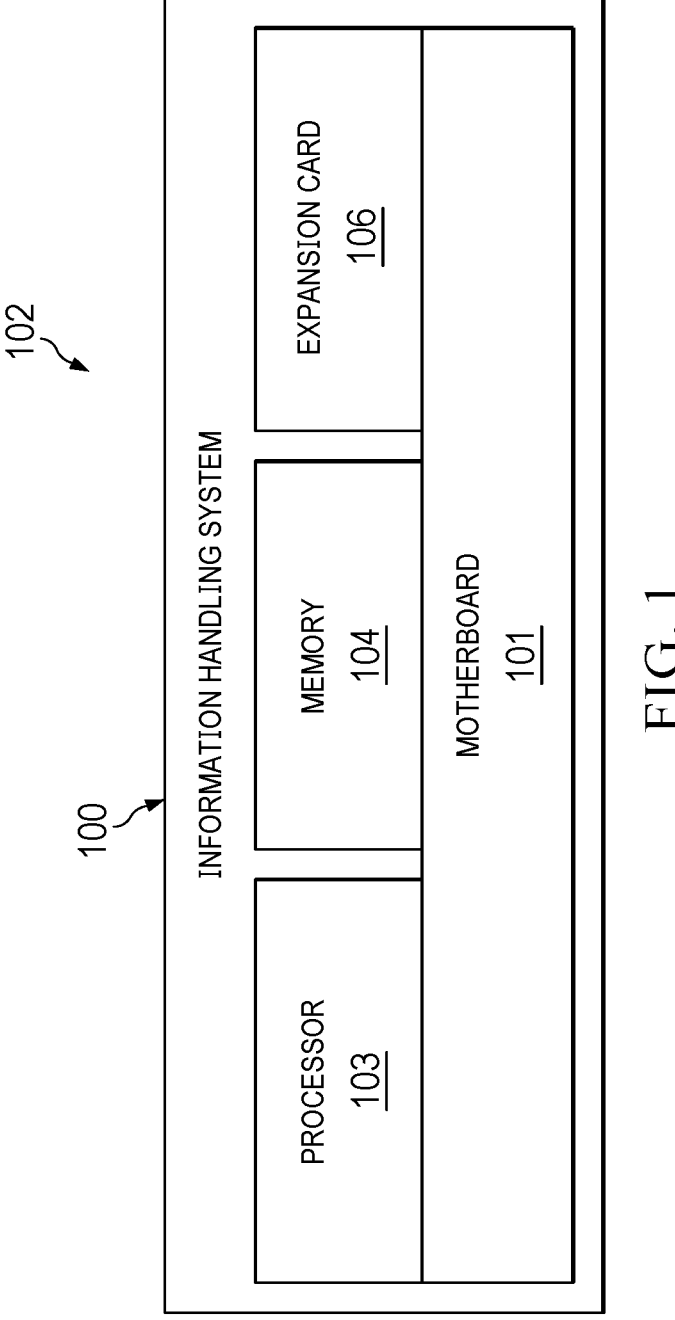
FIG. 1 illustrates a block diagram of selected components of an example information handling system, in accordance with embodiments of the present disclosure.

FIG. 1 illustrates a block diagram of selected components of an example information handling system 102. In some embodiments, information handling system 102 may comprise a server. In other embodiments, information handling system 102 may comprise networking equipment for facilitating communication over a communication network. In yet other embodiments, information handling system 102 may comprise a personal computer, such as a laptop, notebook, or desktop computer.

As shown in FIG. 1, information handling system 102 may include a chassis 100 that houses a motherboard 101, a processor 103 coupled to motherboard 101, a memory 104 coupled to motherboard 101, and an expansion card 106 mechanically and electrically coupled to motherboard 101.

Chassis 100 may include any suitable housing or enclosure configured to house the various components of information handling system 102, and may be constructed from metal, plastic, and/or any other suitable material.

Motherboard 101 may comprise a circuit board configured to provide structural support for one or more information handling resources of information handling system 102 and/or electrically couple one or more of such information handling resources to each other and/or to other electric or electronic components external to information handling system 102.

Processor 103 may include any system, device, or apparatus configured to interpret and/or execute program instructions and/or process data, and may include, without limitation, a microprocessor, microcontroller, digital signal processor (DSP), application specific integrated circuit (ASIC), or any other digital or analog circuitry configured to interpret and/or execute program instructions and/or process data. In some embodiments, processor 103 may interpret and/or execute program instructions and/or process data stored in a storage resource, memory system 104, and/or another component of information handling system 102.

Memory 104 may be communicatively coupled to processor 103 and may comprise any system, device, or apparatus operable to retain program instructions or data for a period of time (e.g., computer-readable media). Memory 104 may comprise random access memory (RAM), electrically erasable programmable read-only memory (EEPROM), a PCMCIA card, flash memory, magnetic storage, opto-magnetic storage, or any suitable selection and/or array of volatile or non-volatile memory that retains data after power to information handling system 102 is turned off. In particular embodiments, memory 104 may comprise dynamic random access memory (DRAM).

Expansion card 106 may comprise any suitable circuit board. In some embodiments, expansion card 106 may comprise a riser card. Although not explicitly shown in FIG. 1, motherboard 101 and expansion card 106 may each have respective connectors for electrically and manually coupling expansion card 106 to motherboard 101. For example, in some embodiments, expansion card 106 may have an edge connector formed on an edge thereof configured to couple to a corresponding receptacle connector either surface-mounted to motherboard 101 or edge-mounted (e.g., a straddle-mount connector) to motherboard 101.

In addition to motherboard 101, processor 103, memory 104, and expansion card 106, information handling system 102 may include one or more other information handling resources.

Figure 2:
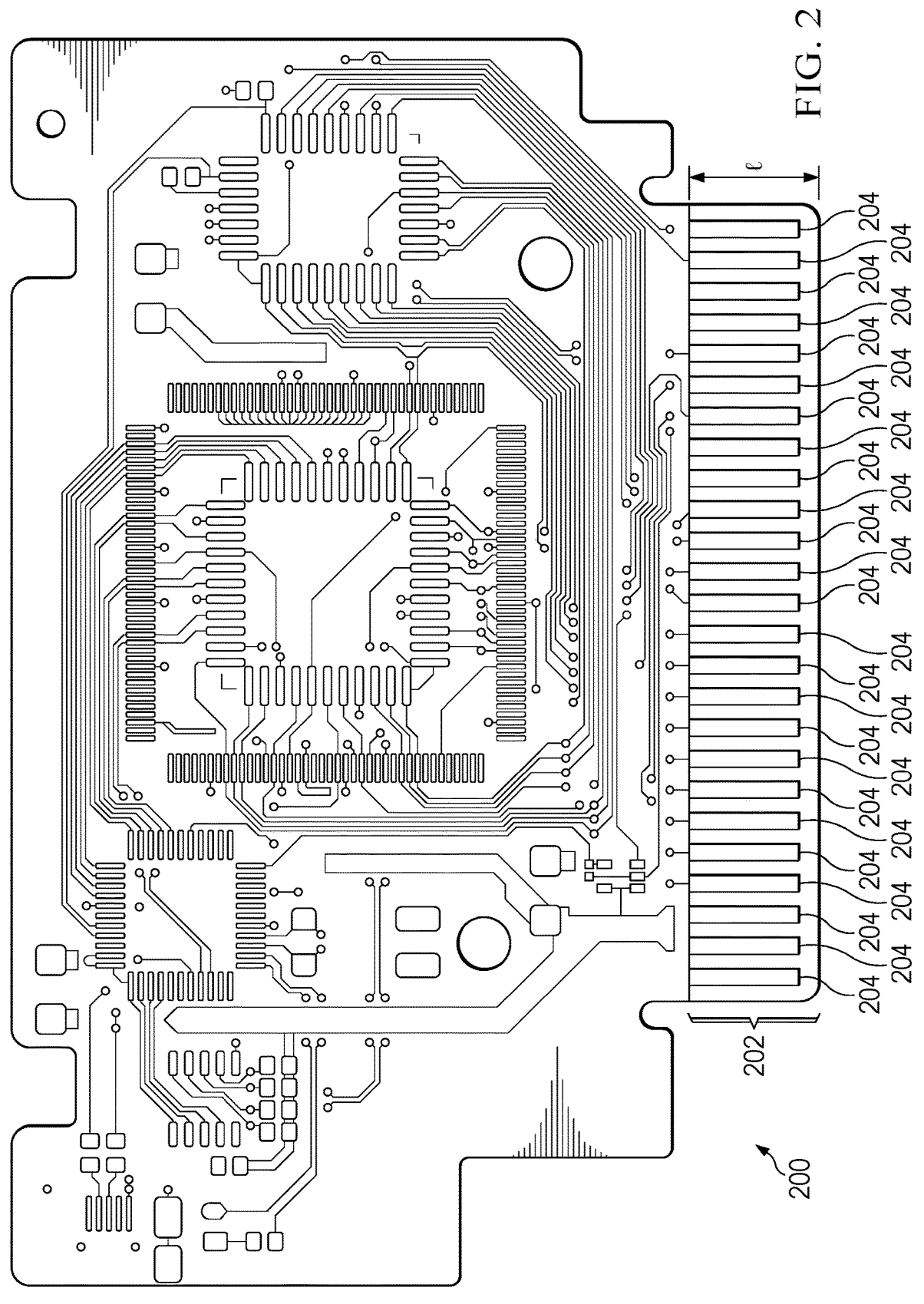
FIG. 2 illustrates a plan view of one side of an example circuit board, in accordance with the present disclosure.

FIG. 2 illustrates a plan view of one side of example circuit board 200, in accordance with the present disclosure. Circuit board 200 may be used to implement motherboard 101, expansion card 106, or any other suitable circuit board.

As shown in FIG. 2, circuit board 200 may have formed at an edge thereof a pad region 202 comprising a plurality of parallel electrically-conductive pads 204. In addition to pads 204 shown on the side of circuit board 200 depicted in FIG. 2, pad region 202 may also include a plurality of parallel electrically-conductive pads 204 on the opposite side of the side of circuit board 200 depicted in FIG. 2. In some embodiments, pad region 202 may implement an edge connector for circuit board 200.

Each pad 204 may be formed from an electrically conductive material (e.g., aluminum, copper, or other metal) and may be plated with gold or another metal. A pad 204 may further be electrically coupled to one or more traces, vias, and components of circuit board 200. In some embodiments, one or more of pads 204 may be formed within a guide channel comprising metal of circuit board 200 on a metal layer of circuit board 200 other than metal formed on a surface of circuit board 200, as described in greater detail below with respect to FIGS. 3A-4C.

Figure 3A:
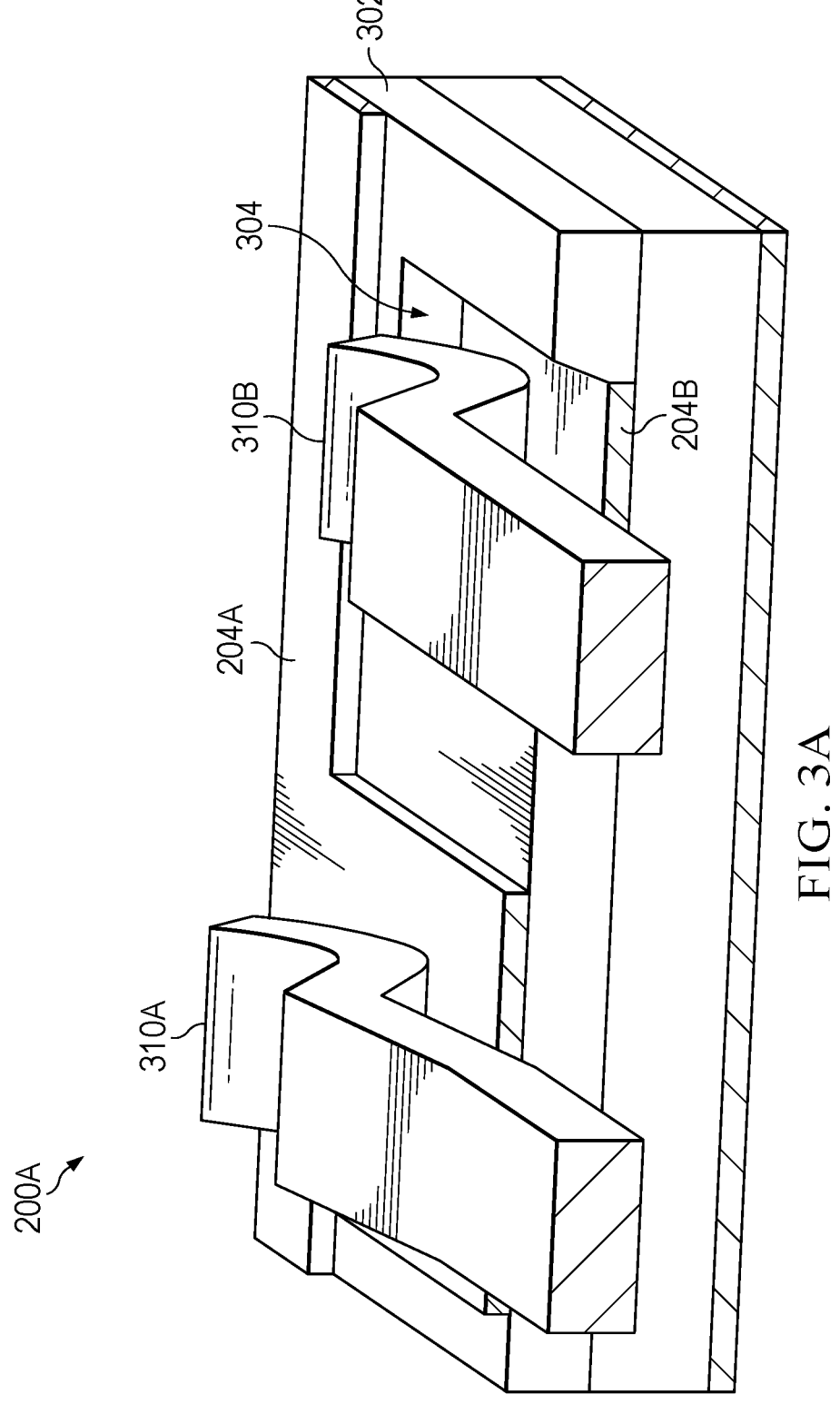
FIGS. 3A-3C illustrate various perspective views of a portion of a circuit board having a pad formed within a guide channel formed through a surface dielectric layer of the circuit board, in accordance with the present disclosure.
Figure 3B:
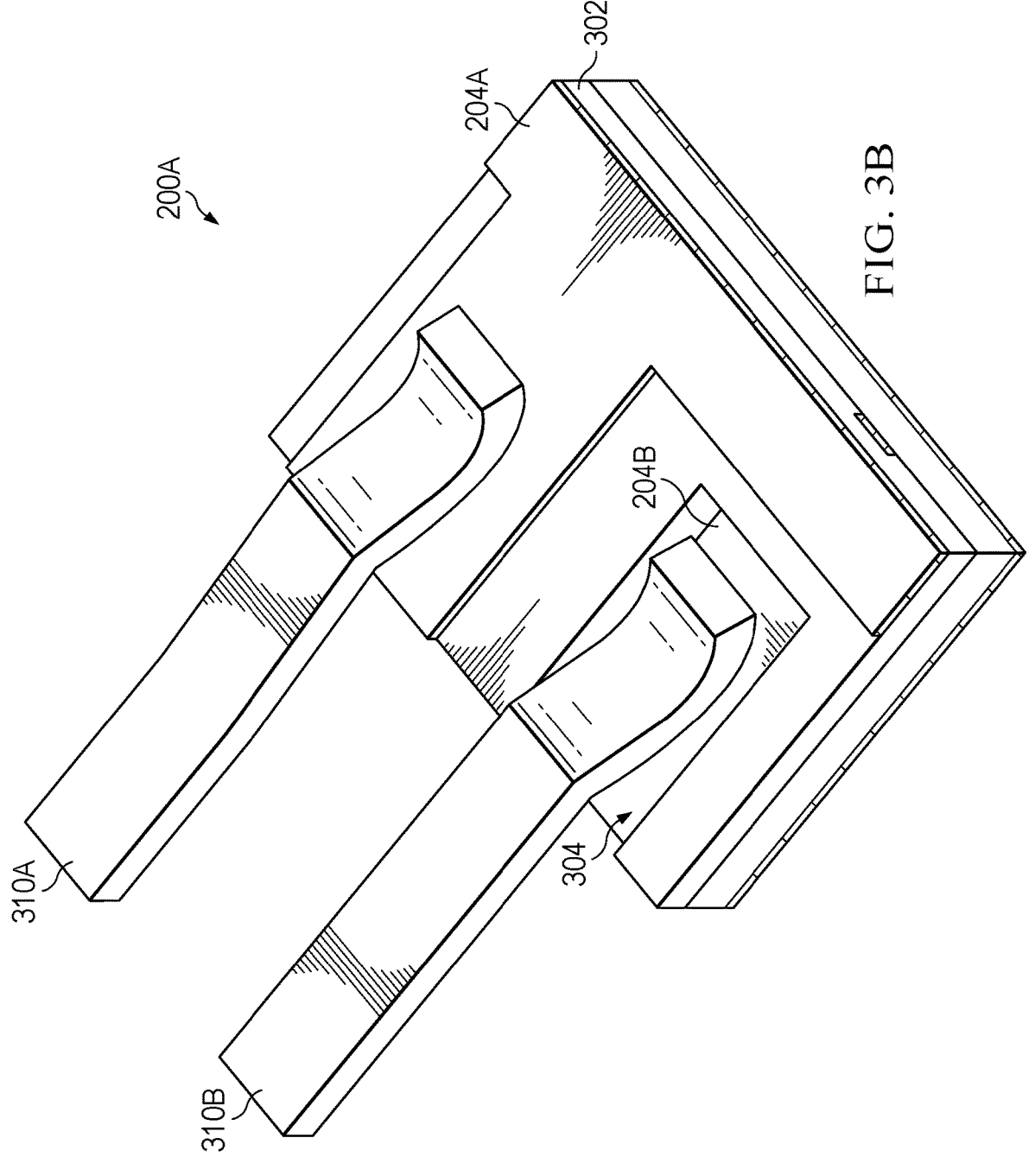
Figure 3C:
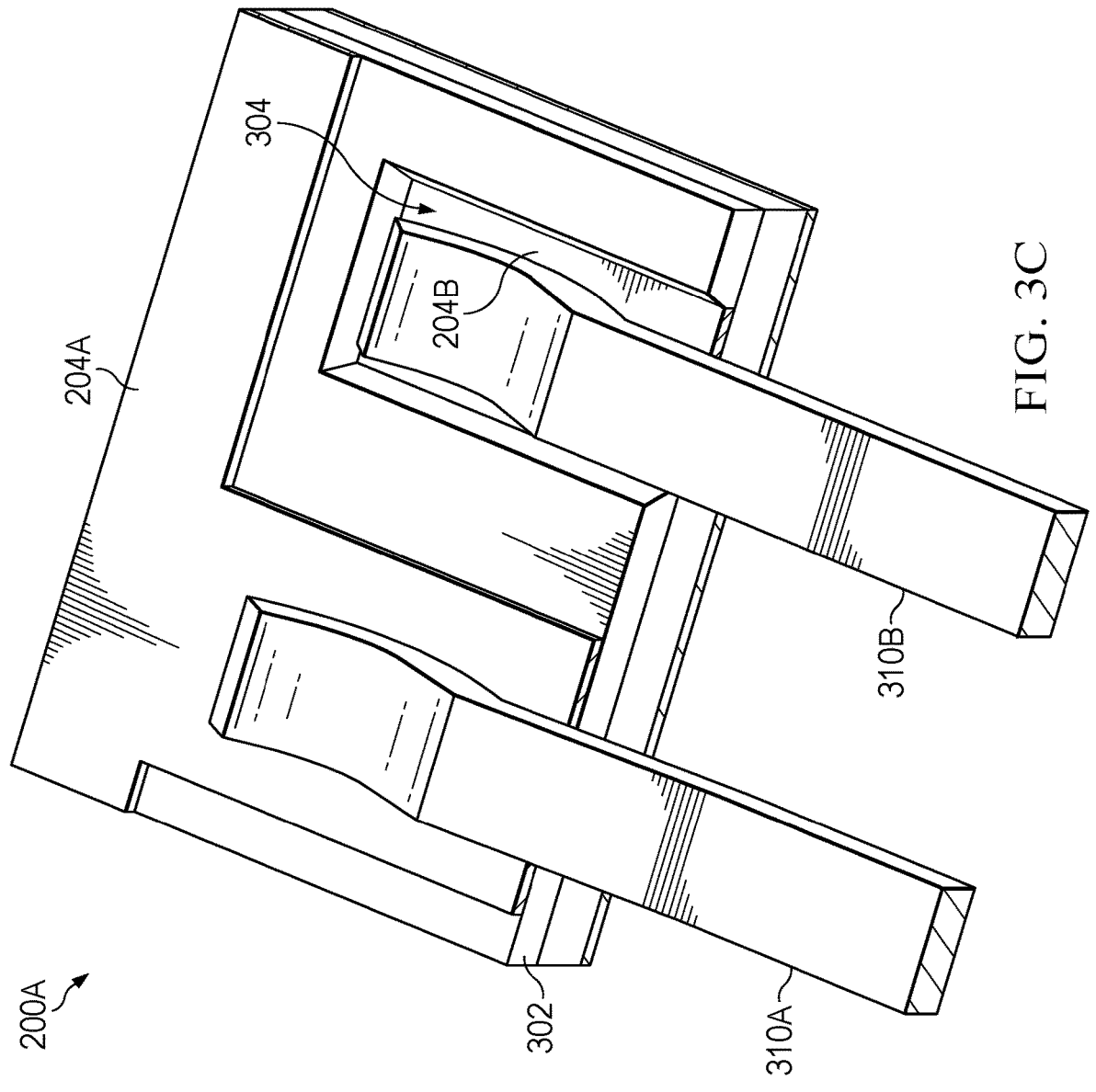

FIGS. 3A-3C illustrate various perspective views of a portion of a circuit board 200A having a pad 204B formed on a subsurface metal layer and within a guide channel 304 formed through a surface dielectric layer 302 of circuit board 200A, in accordance with the present disclosure. Circuit board 200A as shown in FIGS. 3A-3C may be used to implement circuit board 200 depicted in FIG. 2.

Circuit board 200A may include a plurality of pads 204, traces, and vias. Pads 204 may comprise a conductive material and may be formed on a surface (e.g., top or bottom surface) of circuit board 200A (e.g., as in the case of pad 204A) or within an internal metal layer of circuit board 200A (e.g., as in the case of pad 204B). Further, each pad 204 may be operable to couple to a corresponding pin 310 of an electronic component (e.g., a pin of a straddle-mount connector or a pin of a receptacle connector) and provide electrical connectivity between the pin and one or more traces. Traces may comprise a conductive material and may be formed on a surface of circuit board 200A, or in a layer of circuit board 200A not visible from the surface thereof. Further, each trace may be operable to provide conductive pathways between electronic components electrically coupled to pads 204. Connectivity between pads 204 and/or traces disposed on and/or in various layers of circuit board 200A may be provided by vias.

As shown in FIGS. 3A-3C, pad 204A may be patterned or otherwise formed on surface dielectric layer 302 and configured to couple to a corresponding pin 310A. Further, as shown in FIG. 3A-3C, portions of surface dielectric layer 302 may be removed (or otherwise absent), creating a guide channel 304 within which a pad 204B may be patterned or otherwise formed in an internal metal layer of circuit board 200A, wherein pad 204B may be configured to couple to a corresponding pin 310B.

Although for the purposes of clarity and exposition, FIGS. 3A-3C depict only a single pad 204A on the surface metal layer of circuit board 200A and only a single pad 204B within an internal metal layer of circuit board 200A, circuit board 200A may include multiple pads 204A on the surface metal layer of circuit board 200A and/or multiple pads 204B within one or more internal metal layers of circuit board 200A.

Circuit board 200A may enable direct coupling of pins 310 (e.g., pin 310B) to a pad 204 (e.g., pad 204B) in a subsurface metal layer of circuit board 200A. Accordingly, high-speed signals routed in a subsurface metal layer may be more directly coupled to corresponding pins 310, eliminating parasitic effects associated with routing signals through vias of circuit board 200A.

In addition, channel 304 formed in surface dielectric layer 302 may act as a guiding feature to guide a pin 310 in contact with a corresponding pad 204 formed in a subsurface metal layer of circuit board 200A. For example, in some embodiments, channel 304 may have slanted walls (e.g., walls which are not perpendicular to surface dielectric layer 302) to aid in such guiding of pin 310.

Figure 4A:
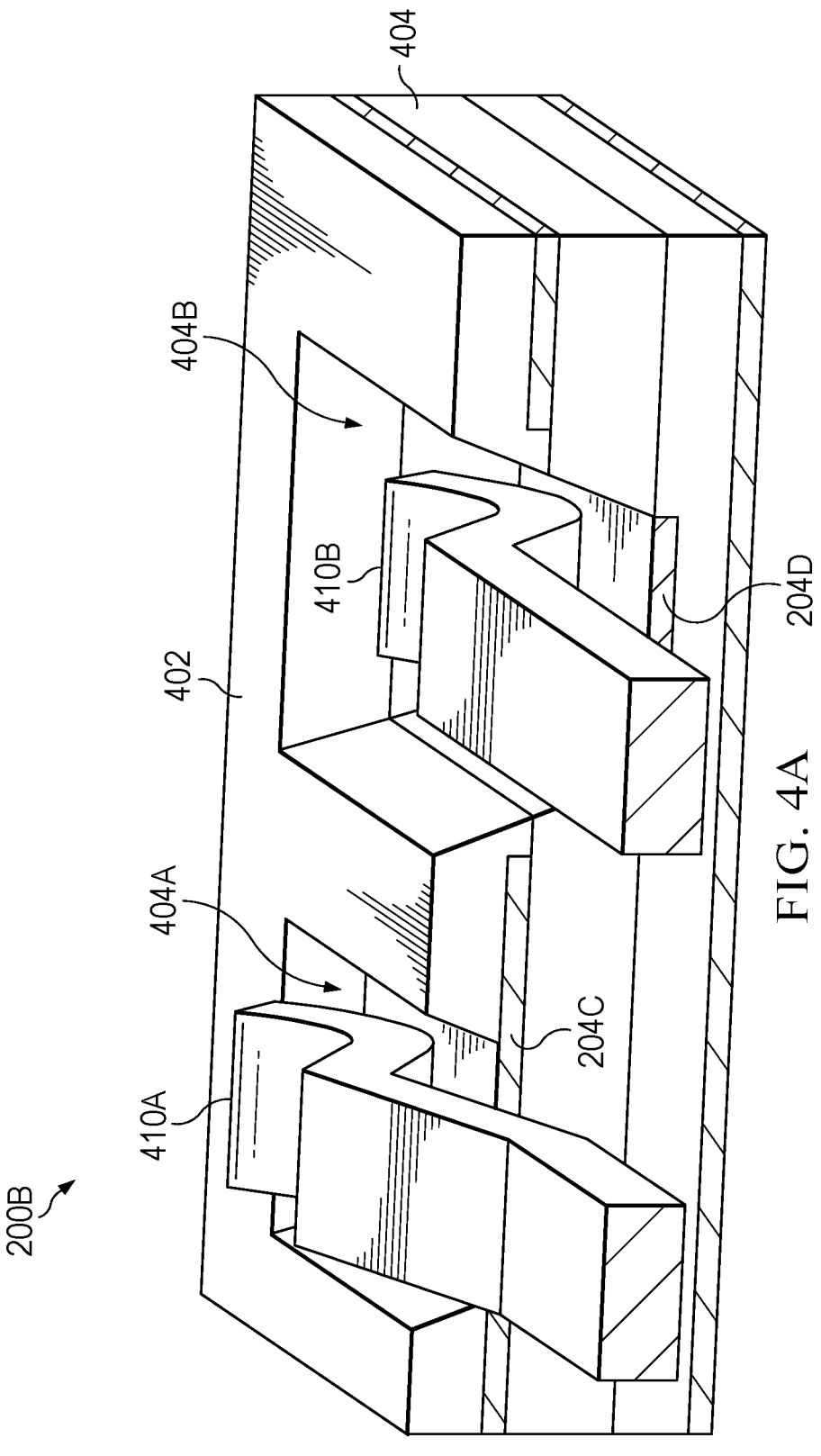
FIGS. 4A-4C illustrate various perspective views of a portion of a circuit board having a pad formed within a guide channel formed through a surface dielectric layer and a subsurface dielectric layer of the circuit board, in accordance with the present disclosure.
Figure 4B:
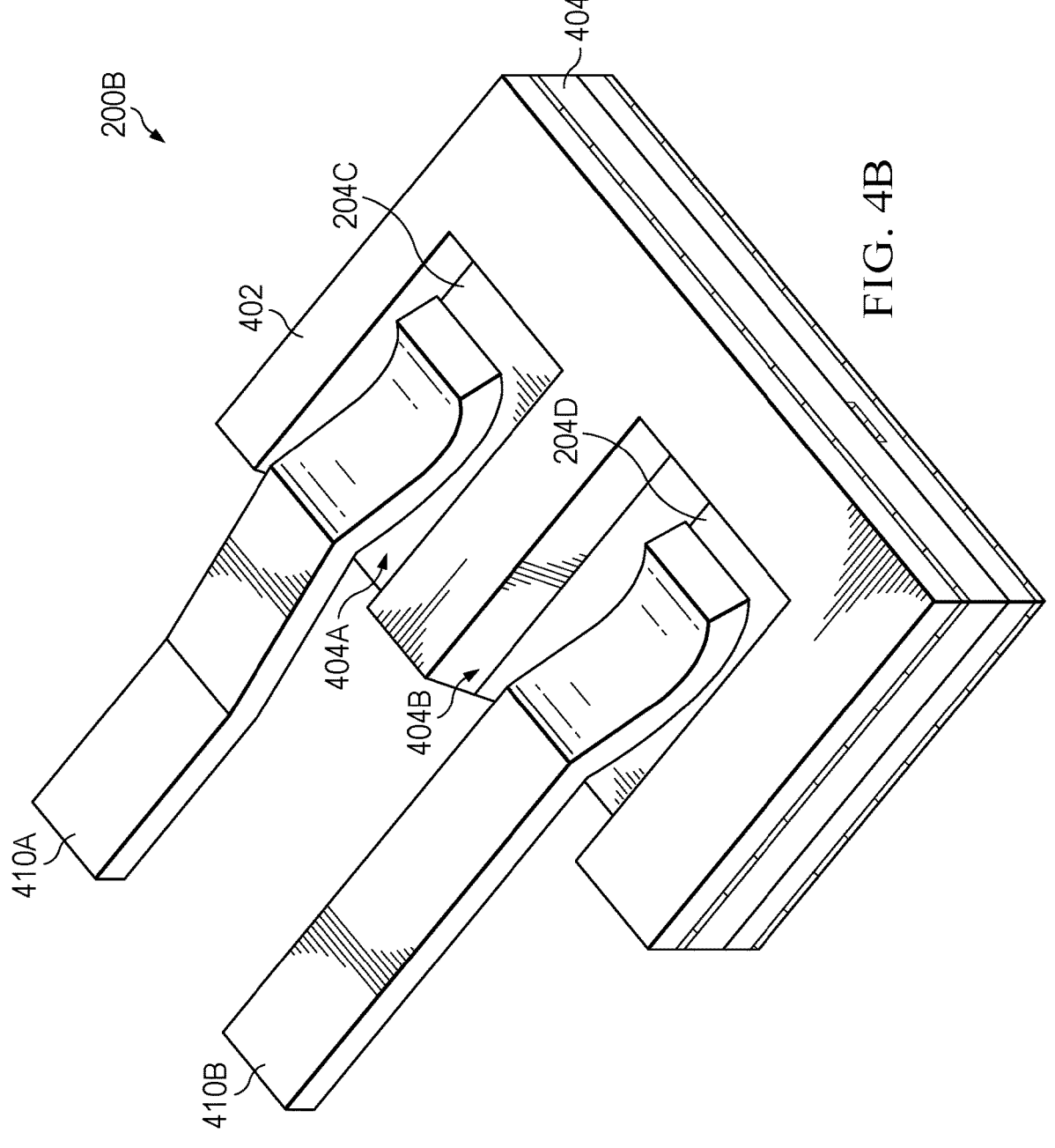
Figure 4C:
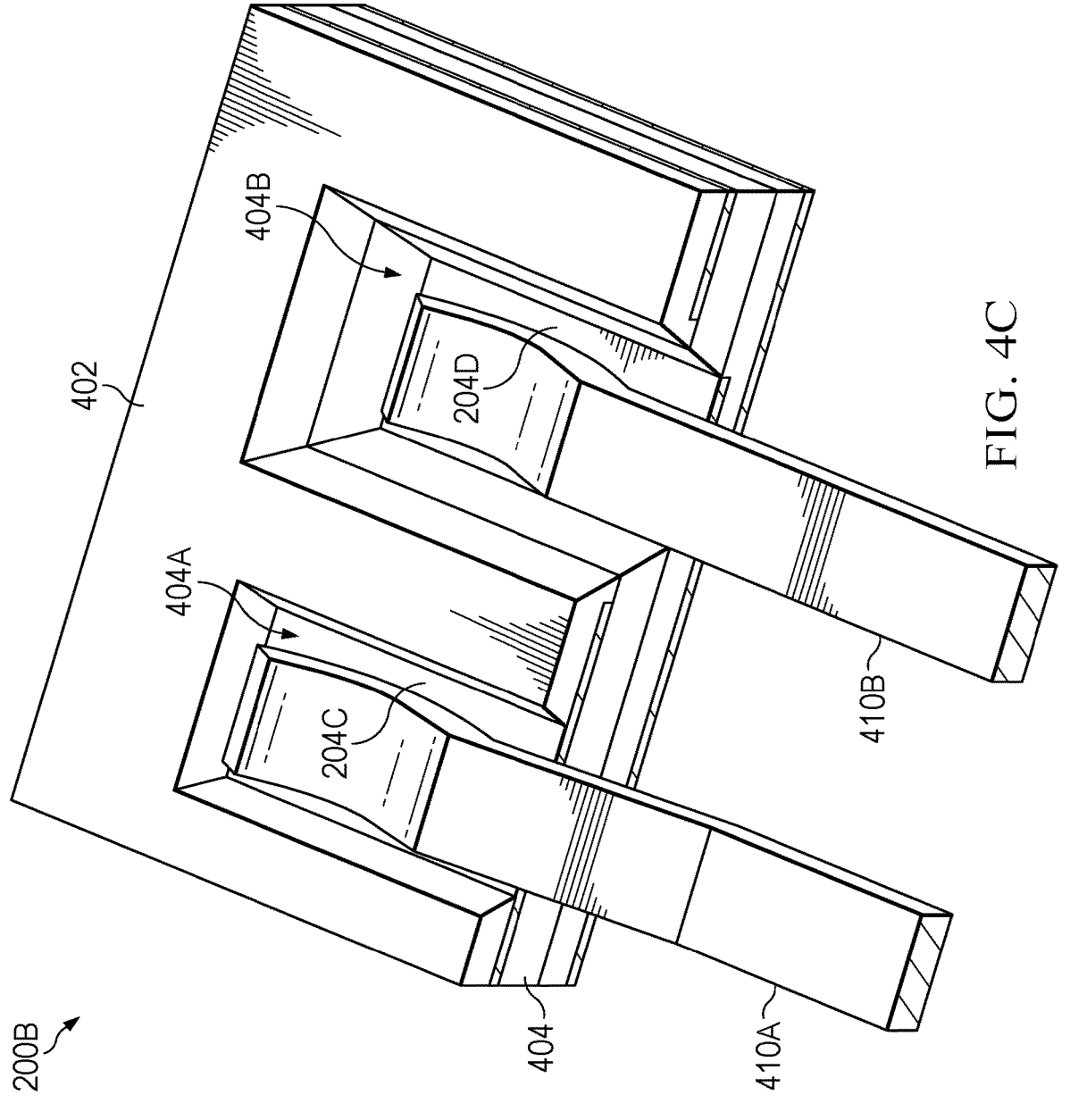

FIGS. 4A-4C illustrate various perspective views of a portion of a circuit board 200B having pads 204C and 204D formed on subsurface metal layers and within a guide channel 404A formed through a surface dielectric layer 402 of circuit board 200B and a guide channel 404B formed through surface dielectric layer 402 and a subsurface dielectric layer 404, in accordance with the present disclosure. Circuit board 200B as shown in FIGS. 4A-4C may be used to implement circuit board 200 depicted in FIG. 2.

Circuit board 200B may include a plurality of pads 204, traces, and vias. Pads 204 may comprise a conductive material and may be formed on a surface (e.g., top or bottom surface) of circuit board 200B or within an internal metal layer of circuit board 200B (e.g., as in the case of pads 204C and 204D). Further, each pad 204 may be operable to couple to a corresponding pin 410 of an electronic component (e.g., a pin of a straddle-mount connector or a pin of a receptacle connector) and provide electrical connectivity between the pin and one or more traces. Traces may comprise a conductive material and may be formed on a surface of circuit board 200B, or in a layer of circuit board 200B not visible from the surface thereof. Further, each trace may be operable to provide conductive pathways between electronic components electrically coupled to pads 204. Connectivity between pads 204 and/or traces disposed on and/or in various layers of circuit board 200B may be provided by vias.

As shown in FIGS. 4A-4C, portions of surface dielectric layer 402 may be removed (or otherwise absent), creating a guide channel 404A within which a pad 204C may be patterned or otherwise formed in an internal metal layer of circuit board 200B, wherein pad 204C may be configured to couple to a corresponding pin 410A. Further, portions of surface dielectric layer 402 and subsurface dielectric layer 404 may be removed (or otherwise absent), creating a guide channel 404B within which a pad 204D may be patterned or otherwise formed in another internal metal layer of circuit board 200B, wherein pad 204D may be configured to couple to a corresponding pin 410B.

Although for the purposes of clarity and exposition, FIGS. 4A-4C depict only a single pad 204C within a first internal metal layer of circuit board 200B and only a single pad 204D within a second internal metal layer of circuit board 200B, circuit board 200B may include multiple pads 204 on the surface metal layer of circuit board 200B and/or multiple pads 204 within one or more internal metal layers of circuit board 200B.

As is the case for circuit board 200A, circuit board 200B may enable direct coupling of pins 410 to pads in subsurface metal layers of circuit board 200B. Accordingly, high-speed signals routed in a subsurface metal layer may be more directly coupled to corresponding pins 410, eliminating parasitic effects associated with routing signals through vias of circuit board 200B.

In addition, channels 404 formed in circuit board 200B may act as a guiding feature to guide a pin 410 in contact with a corresponding pad 204 formed in a subsurface metal layer of circuit board 200B. For example, in some embodiments, a channel 404 may have slanted walls (e.g., walls which are not perpendicular to surface dielectric layers 402 and 404) to aid in such guiding of pin 410.

Although, for the purposes of clarity and exposition, FIGS. 4A-4C depict pads 204 formed in only two internal metal layers of circuit board 200B, it is understood that pads 204, and corresponding channels 404, may be formed on any surface layer or any suitable internal metal layer.

As used herein, when two or more elements are referred to as "coupled" to one another, such term indicates that such two or more elements are in electronic communication or mechanical communication, as applicable, whether connected indirectly or directly, with or without intervening elements.

This disclosure encompasses all changes, substitutions, variations, alterations, and modifications to the example embodiments herein that a person having ordinary skill in the art would comprehend. Similarly, where appropriate, the appended claims encompass all changes, substitutions, variations, alterations, and modifications to the example embodiments herein that a person having ordinary skill in the art would comprehend. Moreover, reference in the appended claims to an apparatus or system or a component of an apparatus or system being adapted to, arranged to, capable of, configured to, enabled to, operable to, or operative to perform a particular function encompasses that apparatus, system, or component, whether or not it or that particular function is activated, turned on, or unlocked, as long as that apparatus, system, or component is so adapted, arranged, capable, configured, enabled, operable, or operative. Accordingly, modifications, additions, or omissions may be made to the systems, apparatuses, and methods described herein without departing from the scope of the disclosure. For example, the components of the systems and apparatuses may be integrated or separated. Moreover, the operations of the systems and apparatuses disclosed herein may be performed by more, fewer, or other components and the methods described may include more, fewer, or other steps. Additionally, steps may be performed in any suitable order. As used in this document, "each" refers to each member of a set or each member of a subset of a set.

Although exemplary embodiments are illustrated in the figures and described below, the principles of the present disclosure may be implemented using any number of techniques, whether currently known or not. The present disclosure should in no way be limited to the exemplary implementations and techniques illustrated in the drawings and described above.

Unless otherwise specifically noted, articles depicted in the drawings are not necessarily drawn to scale.

All examples and conditional language recited herein are intended for pedagogical objects to aid the reader in understanding the disclosure and the concepts contributed by the inventor to furthering the art, and are construed as being without limitation to such specifically recited examples and conditions. Although embodiments of the present disclosure have been described in detail, it should be understood that various changes, substitutions, and alterations could be made hereto without departing from the spirit and scope of the disclosure.

Although specific advantages have been enumerated above, various embodiments may include some, none, or all of the enumerated advantages. Additionally, other technical advantages may become readily apparent to one of ordinary skill in the art after review of the foregoing figures and description.

To aid the Patent Office and any readers of any patent issued on this application in interpreting the claims appended hereto, applicants wish to note that they do not intend any of the appended claims or claim elements to invoke 35 U.S.C. § 112(f) unless the words "means for" or "step for" are explicitly used in the particular claim.

What is claimed is:

1. A circuit board, comprising:
a plurality of electrically-conductive layers separated and supported by a plurality of dielectric layers of insulating material laminated together; and
a channel formed at an edge of the circuit board through at least one dielectric layer of the plurality of dielectric layers within which an electrically-conductive pad is formed from an internal electrically-conductive layer of one of the plurality of electrically-conductive layers, wherein the at least one dielectric layer forms a first wall of the channel and a second wall of the channel opposite to the first wall.

2. The circuit board of claim 1, wherein the internal electrically-conductive layer is a layer immediately below a surface dielectric layer of the plurality of dielectric layers.

3. The circuit board of claim 1, wherein the internal electrically-conductive layer is a layer internal to the circuit board other than a layer immediately below a surface dielectric layer of the plurality of dielectric layers.

4. The circuit board of claim 1, further comprising a second electrically-conductive pad formed upon a surface dielectric layer of the plurality of dielectric layers.

5. The circuit board of claim 1, wherein the electrically-conductive pad is configured to engage with a pin of a connector.

6. The circuit board of claim 5, wherein the connector is a straddle-mount connector configured to couple to the circuit board.

7. The circuit board of claim 5, wherein the connector is a receptacle connector configured to couple to the circuit board.

8. An information handling system comprising:
a processor; and
a circuit board, comprising:
a plurality of electrically-conductive layers separated and supported by a plurality of dielectric layers of insulating material laminated together; and
a channel formed at an edge of the circuit board through at least one dielectric layer of the plurality of dielectric layers within which an electrically-conductive pad is formed from an internal electrically-conductive layer of one of the plurality of electrically-conductive layers, wherein the at least one dielectric layer forms a first wall of the channel and a second wall of the channel opposite to the first wall.

9. The information handling system of claim 8, wherein the internal electrically-conductive layer is a layer immediately below a surface dielectric layer of the plurality of dielectric layers.

10. The information handling system of claim 8, wherein the internal electrically-conductive layer is a layer internal to the circuit board other than a layer immediately below a surface dielectric layer of the plurality of dielectric layers.

11. The information handling system of claim 8, the circuit board further comprising a second electrically-conductive pad formed upon a surface dielectric layer of the plurality of dielectric layers.

12. The information handling system of claim 8, wherein the electrically-conductive pad is configured to engage with a pin of a connector.

13. The information handling system of claim 12, wherein the connector is a straddle-mount connector configured to couple to the circuit board.

14. The information handling system of claim 12, wherein the connector is a receptacle connector configured to couple to the circuit board.

15. A method comprising, in a circuit board having a plurality of electrically-conductive layers separated and supported by a plurality of dielectric layers of insulating material laminated together:
forming a channel at an edge of the circuit board through at least one dielectric layer of the plurality of dielectric layers, wherein the at least one dielectric layer forms a first wall of the channel and a second wall of the channel opposite to the first wall; and
forming within the channel an electrically-conductive pad from an internal electrically-conductive layer of one of the plurality of electrically-conductive layers.

16. The method of claim 15, wherein the internal electrically-conductive layer is a layer immediately below a surface dielectric layer of the plurality of dielectric layers.

17. The method of claim 15, wherein the internal electrically-conductive layer is a layer internal to the circuit board other than a layer immediately below a surface dielectric layer of the plurality of dielectric layers.

18. The method of claim 15, further comprising forming a second electrically-conductive pad upon a surface dielectric layer of the plurality of dielectric layers.

19. The method of claim 15, wherein the electrically-conductive pad is configured to engage with a pin of a connector.

20. The method of claim 19, wherein the connector is a straddle-mount connector configured to couple to the circuit board.

21. The method of claim 19, wherein the connector is a receptacle connector configured to couple to the circuit board.

\* \* \* \* \*